United States Patent
Kuroda et al.

(10) Patent No.: US 9,947,582 B1
(45) Date of Patent: Apr. 17, 2018

(54) PROCESSES FOR PREVENTING OXIDATION OF METAL THIN FILMS

(71) Applicant: ASM IP HOLDING B.V., Almere (NL)

(72) Inventors: Aurélie Kuroda, Chofu (JP); Shang Chen, Sagamihara (JP); Takahiro Onuma, Tama (JP); Dai Ishikawa, Ome (JP)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 15/612,962

(22) Filed: Jun. 2, 2017

(51) Int. Cl.
*H01L 21/768* (2006.01)
*H01L 23/532* (2006.01)
*H01L 23/522* (2006.01)

(52) U.S. Cl.
CPC .. *H01L 21/76888* (2013.01); *H01L 21/76849* (2013.01); *H01L 23/5226* (2013.01); *H01L 23/53209* (2013.01); *H01L 23/53228* (2013.01); *H01L 23/53257* (2013.01)

(58) Field of Classification Search
None
See application file for complete search history.

(56) References Cited

U.S. PATENT DOCUMENTS

| | | |
|---|---|---|
| 5,447,887 A | 9/1995 | Filipiak et al. |
| 6,586,330 B1 | 7/2003 | Ludviksson et al. |
| 6,759,325 B2 | 7/2004 | Raaijmakers et al. |
| 6,844,258 B1 | 1/2005 | Fair et al. |
| 6,878,628 B2 | 4/2005 | Sophie et al. |
| 6,958,174 B1 | 10/2005 | Klaus et al. |
| 7,084,060 B1 | 8/2006 | Furukawa et al. |
| 7,323,411 B1 | 1/2008 | Blosse |
| 7,476,618 B2 | 1/2009 | Kilpela et al. |
| 7,629,256 B2 | 12/2009 | Hasper |
| 7,964,505 B2 | 6/2011 | Khandelwal et al. |
| 8,841,182 B1 | 9/2014 | Chen et al. |
| 8,890,264 B2 | 11/2014 | Dewey et al. |

(Continued)

FOREIGN PATENT DOCUMENTS

| | | |
|---|---|---|
| WO | WO 2014/209390 | 12/2014 |
| WO | WO 2015/047345 | 4/2015 |

(Continued)

OTHER PUBLICATIONS

Child et al., "Application of Silane Technology to Prevent Corrosion of Metals and Improve Paint Adhesion", Transactions of the IMF, v77 n2, (19990101): 64-70.*

(Continued)

*Primary Examiner* — Asok K Sarkar
(74) *Attorney, Agent, or Firm* — Knobbe, Martens, Olson & Bear LLP

(57) ABSTRACT

Processes are provided herein for protecting metal thin films from oxidation when exposed to an oxidizing environment, such as the ambient atmosphere. The processes may comprise a protective treatment including exposing the metal thin film to a silicon-containing precursor at a temperature of about 200° C. or less in order to selectively adsorb a silicon-containing protective layer on the metal thin film. The silicon-containing protective layer may reduce or substantially prevent the underlying metal thin film from oxidation.

21 Claims, 13 Drawing Sheets

(56) References Cited

U.S. PATENT DOCUMENTS

| | | | |
|---|---|---|---|
| 8,993,404 B2 | 3/2015 | Korbrinsky et al. | |
| 9,067,958 B2 | 6/2015 | Romero et al. | |
| 9,112,003 B2 | 8/2015 | Haukka et al. | |
| 9,236,292 B2 | 1/2016 | Romero et al. | |
| 9,257,303 B2 | 2/2016 | Haukka et al. | |
| 9,502,289 B2 | 11/2016 | Haukka et al. | |
| 2002/0047144 A1 | 4/2002 | Nguyen et al. | |
| 2002/0068458 A1 | 6/2002 | Chiang et al. | |
| 2003/0143839 A1 | 7/2003 | Raaijmakers et al. | |
| 2003/0181035 A1 | 9/2003 | Yoon et al. | |
| 2005/0136604 A1 | 6/2005 | Al-Bayati et al. | |
| 2007/0099422 A1 | 5/2007 | Wijekoon et al. | |
| 2008/0241575 A1 | 10/2008 | Lavoie et al. | |
| 2009/0269507 A1 | 10/2009 | Yu et al. | |
| 2011/0124192 A1 | 5/2011 | Ganguli et al. | |
| 2012/0032311 A1 | 2/2012 | Gates et al. | |
| 2012/0189868 A1 | 7/2012 | Borovik et al. | |
| 2012/0219824 A1 | 8/2012 | Prolier et al. | |
| 2012/0264291 A1 | 10/2012 | Ganguli et al. | |
| 2013/0196502 A1 | 8/2013 | Haukka et al. | |
| 2014/0001572 A1 | 1/2014 | Bohr et al. | |
| 2014/0091308 A1 | 4/2014 | Dasgupta et al. | |
| 2014/0152383 A1 | 6/2014 | Nikonov et al. | |
| 2014/0273527 A1 | 9/2014 | Niskanen et al. | |
| 2015/0093890 A1 | 4/2015 | Blackwell et al. | |
| 2015/0097292 A1 | 4/2015 | He et al. | |
| 2015/0179798 A1 | 6/2015 | Clendenning et al. | |
| 2015/0371866 A1 | 12/2015 | Chen et al. | |
| 2016/0289458 A1* | 10/2016 | Linford | C09D 5/08 |
| 2017/0058401 A1 | 3/2017 | Blackwell et al. | |

FOREIGN PATENT DOCUMENTS

| WO | WO 2015094305 | 6/2015 |
|---|---|---|
| WO | WO 2015147843 | 10/2015 |
| WO | WO 2015147858 | 10/2015 |

OTHER PUBLICATIONS

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.

Bouteville et al., "Selective R.T.L.P.C.V.D. Of Tungsten by Silane Reduction on Patterned PPQ/Si Wafers" Journal De Physique IV, Colloque C2, suppl. au Journal de Physique II, vol. 1, Sep. 1991, pp. C2-857-C2-864.

Carlsson, J., "Precursor Design for Chemical Vapour Deposition", Acta Chemica Scandinavica, vol. 45, 1991, pp. 864-869.

Chang et al, "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.

Elam et al., "Kinetics of the WF6 and Si2H6 surface reactions during tungsten atomic layer deposition", Surface Science, vol. 479, 2001, pp. 121-135.

Elam et al., "Nucleation and growth during tungsten atomic layer deposition on SiO2 surfaces", Thin Solid Films, vol. 386, 2001 pp. 41-52.

Fabreguette et al., Quartz crystal microbalance study of tungsten atomic layer deposition using WF6 and Si2H6, Thin Solid Films, vol. 488, 2005, pp. 103-110.

Grubbs et al., "Nucleation and growth during the atomic layer deposition of W on Al2O3 and Al2O3 on W", Thin Solid Films, vol. 467, 2004, pp. 16-27.

Hymes et al., "Surface cleaning of copper by thermal and plasma treatment in reducing and inert ambients", J. Vac. Sci. Technol. B, vol. 16, No. 3, May/Jun. 1998, pp. 1107-1109.

International Search Report and Written Opinion dated Feb. 17, 2012 in Application No. PCT/US2011/039970, filed Jun. 10, 2011.

Klaus et al., "Atomic layer deposition of tungsten using sequential surface chemistry with a sacrificial stripping reaction", Thin Solid Films, vol. 360, 2000, pp. 145-153.

Klaus et al., "Atomically controlled growth of tungsten and tungsten nitride using sequential surface reactions", Applied Surface Science 162-163, 2000, pp. 479-491.

Lei et al., "Real-time observation and opitimization of tungsten atomic layer deposition process cycle", J. Vac. Sci. Technol. B, vol. 24, No. 2, Mar./Apr. 2006, pp. 780-789.

Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.

Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.

Lohokare et al., "Reactions of Disilane on Cu(111): Direct Observation of Competitive Dissociation, Disproportionation, and Thin Film Growth Processes", Langmuir 1995, vol. 11, pp. 3902-3912.

Maluf et al., "Selective tungsten filling of sub-0.25µm trenches for the fabrication of scaled contacts and x-ray masks", J. Vac. Sci. Technol. B, vol. 8, No. 3, May/Jun. 1990, pp. 568-569.

Proslier et al., "Atomic Layer Deposition and Superconducting Properties of NbSi Films", The Journal of Physical Chemistry C, 2011, vol. 115, No. 50, pp. 1-26.

Roberts et al., "Selective Mn deposition on Cu lines", poster presentation, 12th International Conference on Atomic Layer Deposition, Jun. 19, 2012, Dresden, Germany.

Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.

Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.

* cited by examiner

PROCESSES FOR PREVENTING OXIDATION OF METAL THIN FILMS

BACKGROUND

Field

The present disclosure relates generally to the field of semiconductor fabrication.

Description of the Related Art

Metal oxidation under standard atmospheric conditions is a critical issue for current integrated circuit (IC) applications involving the deposition of metal thin films with thicknesses in the range of a few nanometers.

Cobalt (Co) and tungsten (W) are currently considered as good candidates for thin metal cap layers on copper (Cu) interconnects in order to prevent electromigration. However, Co and W are easily oxidized and a native oxide with a thickness of a few nanometers has been reported in atmospheric conditions. These native oxides can thus have thicknesses comparable to the thickness of the metallic cap layer itself. The presence of a Co or W native oxide can increase the resistivity of the cap layer, thereby reducing the effectiveness of the cap layer.

SUMMARY

According to some aspects, processes for protecting a metal thin film from oxidation in an oxidizing environment are described herein. In some embodiments such processes may comprise depositing a metal thin film on a substrate in a reaction chamber and exposing the deposited metal thin film to a silicon-containing precursor at a process temperature of less than about 200° C. to thereby adsorb no more than about a monolayer of silicon-containing species on the metal thin film, wherein the deposited metal thin film is exposed to the silicon-containing precursor prior to being exposed to an oxidizing environment.

In some embodiments the silicon-containing species are adsorbed on the metal thin film relative to a second, different surface of the substrate with a selectivity of greater than about 50%. In some embodiments a thickness of the adsorbed silicon-containing monolayer is from about 0.1 nm to about 2 nm. In some embodiments the silicon-containing precursor comprises an aminosilane compound. In some embodiments the silicon-containing precursor comprises a silane compound. In some embodiments the silicon-containing precursor comprises disilane. In some embodiments the deposited metal thin film is exposed to the silicon-containing precursor for more than about 10 seconds. In some embodiments the deposited metal thin film is exposed to the silicon-containing precursor for less than about 120 seconds. In some embodiments the deposited metal thin film comprises W, Co, Cu, TiN, TaN, and/or a mixture thereof. In some embodiments the deposited metal thin film comprises Co and/or W. In some embodiments depositing the metal thin film and exposing the deposited metal thin film to the silicon-containing precursor steps are carried out in the same reaction chamber. In some embodiments depositing the metal thin film and exposing the deposited metal thin film to the silicon-containing precursor steps are carried out in different reaction chambers.

According to some aspects processes for protecting a metal thin film from oxidation in an oxidizing environment may comprise providing a metal thin film on a substrate comprising at least a dielectric surface in a reaction chamber and exposing the metal thin film to a silicon-containing precursor at a process temperature of less than about 200° C. to thereby selectively adsorb no more than about a monolayer of silicon-containing species on the metal thin film relative to the dielectric surface of the substrate, wherein the deposited metal thin film is exposed to the silicon containing precursor prior to being exposed to an oxidizing environment, and wherein the silicon-containing species are adsorbed onto the metal thin film relative to the dielectric surface with a selectivity of greater than about 50%.

In some embodiments the silicon-containing precursor comprises a silane compound. In some embodiments the deposited metal thin film is exposed to the silicon-containing precursor for more than about 10 seconds. In some embodiments the deposited metal thin film comprises W, Co, Cu, TiN, TaN, and/or a mixture thereof. In some embodiments the dielectric surface comprises a silicon-containing surface and/or a metal oxide surface. In some embodiments the silicon-containing surface comprises $SiO_2$, SiN, SiOC, SiON, and/or SiOCN. In some embodiments the metal oxide surface comprises $TiO_2$, $Ta_2O_5$, and/or $Al_2O_3$. In some embodiments depositing the metal thin film and exposing the deposited metal thin film to the silicon-containing precursor steps are carried out in the same reaction chamber. In some embodiments depositing the metal thin film and exposing the deposited metal thin film to the silicon-containing precursor steps are carried out in different reaction chambers.

BRIEF DESCRIPTION OF THE DRAWINGS

The invention will be better understood from the Detailed Description and from the appended drawings, which are meant to illustrate and not to limit the invention.

DETAILED DESCRIPTION

Figure 1:
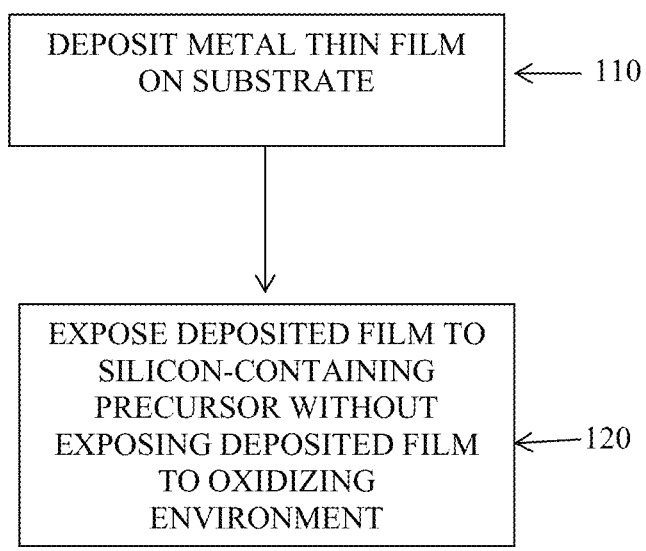
FIG. 1 illustrates a process flow diagram for selectively protecting a thin film from oxidation in an oxidizing environment by contacting the thin film with a silicon-containing precursor according to some embodiments.

In some embodiments methods of protecting metal thin films, for example metal thin films from atmospheric oxidation are disclosed. In some embodiments the method of protecting a metal thin film on a substrate from oxidation may comprise a protective treatment comprising exposing the metal thin film to a vapor-phase silicon-containing compound, also referred to as a silicon-containing precursor. In some embodiments the silicon-containing precursor contacts the metal thin film for a specified duration during the protective treatment. For example, a silicon-containing precursor may be introduced into a reaction chamber containing a substrate comprising the metal thin film, prior to exposing the metal thin film to ambient atmosphere, or some other oxidizing environment to protect the metal thin film from oxidation. In some embodiments the silicon-containing precursor may be introduced into a reaction chamber subsequent to deposition of the metal thin film and prior to exposing the metal thin film to the ambient atmosphere. In some embodiments the temperature during exposure of the metal thin film to a silicon-containing precursor may be, about 200° C. or lower, about 150° C. or lower, about 100° C. or lower, or about 70° C. or lower. In some embodiments the temperature during exposure of the metal thin film to a silicon-containing precursor may still be above about 25° C., above about 50° C., above about 60° C., 65° C., 70° C., 75° C. or greater. In some embodiments the temperature during exposure of the metal thin film to a silicon-containing precursor may have an upper limit of about 200° C.

In some embodiments the protective treatment may comprise exposing the metal thin film to a silicon-containing precursor to selectively form a thin protective silicon-containing layer on the surface of the metal thin film to thereby protect the underlying metal thin film from oxidation. For example, exposing a metal thin film to the silicon-containing precursor may selectively form a thin silicon-containing layer on the metal surface of the metal thin film relative to a second, different surface, such as a dielectric surface adjacent to the metal thin film. In some embodiments the dielectric surface may comprise a silicon-containing surface, such as a $SiO_2$, SiN, SiOC, SiON, and/or SiOCN surface. In some embodiments the dielectric surface may comprise a metal oxide surface, such as a $TiO_2$, $Ta_2O_5$, and/or $Al_2O_3$ surface.

In some embodiments, after a thin silicon-containing layer has been formed on the surface of the metal thin film, the metal thin film may be exposed to an oxidizing environment, such as the ambient atmosphere. In some embodiments the protective silicon-containing metal thin film may reduce, inhibit, or substantially prevent oxidation of the underlying metal thin film upon exposure to an oxidizing environment.

In some embodiments exposing the metal thin film to a silicon-containing precursor may comprise contacting a substrate comprising the metal thin film with the silicon-containing precursor such that species of the silicon-containing precursor are adsorbed onto the surface of the metal thin film to thereby form a silicon-containing protective layer. In some embodiments the silicon-containing precursor may selectively adsorb on the metal surface relative to a second, different surface, such as a dielectric surface. In some embodiments species of the silicon-containing precursor are not adsorbed onto other surfaces of the substrate comprising the metal thin film, such as dielectric surfaces. In some embodiments the silicon-containing species may adsorb in a self-limiting manner to the surface of the metal thin film. In some embodiments the silicon-containing protective layer may comprise a single monolayer of silicon-containing species. In some embodiments the silicon-containing protective layer may comprise less than a complete monolayer of silicon-containing species, for example due to factors such as physical size of the silicon-containing species or "steric hindrance" restraints. In some embodiments the silicon-containing protective layer may comprise no more than about a monolayer. In some embodiments the silicon-containing protective layer may comprise more than one monolayer of silicon-containing species. In some embodiments the silicon-containing protective layer may have a thickness of from about 0.1 nm to about 3 nm, from about 0.1 nm to about 2 nm, from about 0.1 nm to about 1 nm, or from about 0.1 nm to about 0.5 nm.

In some embodiments a silicon-containing precursor is provided in a single continuous pulse, for example into a reaction chamber containing a substrate comprising the metal thin film. In some embodiments only a single silicon-containing precursor is provided, and thus only a single silicon-containing precursor contacts the substrate. In some embodiments a single silicon-containing precursor is provided in a single continuous pulse, for example into a reaction chamber containing a substrate comprising the metal thin film. In some embodiments the silicon-containing precursor is not provided in more than one pulse to the substrate. In some embodiments the step of exposing the metal thin film to a silicon-containing precursor is not repeated.

In some embodiments at least some of the formed thin silicon-containing layer may be oxidized when it is exposed do an oxidizing environment, such as the ambient atmosphere. In some embodiments the silicon-containing layer may be exposed to an oxidant in order to oxidize the silicon-containing layer. For example, the silicon-containing layer may be exposed to $O_2$ and/or $H_2O$. In some embodiments the oxidized silicon-containing layer may comprise silicon oxide, for example in the form of $SiO_2$. In some embodiments the thickness of the silicon oxide layer formed after exposure to an oxidizing environment may be up to about twice as thick as the thickness of the unoxidized silicon-containing protective layer, for example from about 0.2 nm to about 6 nm.

In some embodiments at least some of the thin silicon-containing layer may be oxidized and the underlying metal thin film may not be oxidized, or the oxidation of the underlying metal thin film may be reduced, inhibited, or substantially prevented as compared to a substantially similar metal thin film that has not be protected according to the embodiments described herein. In some embodiments less than about 10 nm, less than about 7 nm, less than about 5 nm, less than about 3 nm, less than about 1 nm, or less of the metal thin film may be oxidized. In some embodiments less than about half of the thickness of the underlying metal thin film may be oxidized. In some embodiments less than about one third, one quarter, one fifth, or one tenth, or less of the underlying metal thin film may be oxidized.

In some embodiments the metal thin film to be protected comprises a metal thin film. In some embodiments the metal thin film may comprise Cu, Co, W, Ti, Ta, TiN, TaN and/or any other metal. The term metal is used herein to refer generally to conductive materials including metallic materials, as well as conductive nitrides, carbides, borides, and/or oxides. The metal thin films can be deposited on a substrate using known vapor deposition processes, such as atomic layer deposition (ALD) or chemical vapor deposition (CVD) processes. In some embodiments the metal thin film may be deposited on a substrate by a thermal vapor deposition process, however in some other embodiments the metal thin film may be deposited by a plasma enhanced vapor deposition process, such as a plasma enhanced ALD (PEALD) or plasma enhanced CVD (PECVD) process. In some embodiments the metal thin film is deposited on a substrate during integrated circuit processing, such as during formation of a cap layer on a metallic interconnect in a dielectric substrate. In some embodiments the metal thin film may be about 100 nm or less, about 50 nm or less, about 10 nm or less, about 7. nm or less, about 5 nm, 4 nm, 3 nm, 2 nm, or 1 nm or less. In some embodiments the metal thin film may have a thickness greater than about 100 nm or more. At a minimum, in some embodiments there is some metal film, such as at least a monolayer of metal film.

In some embodiments a silicon-containing protective layer may be formed or deposited on the metal surface of a substrate comprising a metal thin film. In some embodiments the substrate may comprise other, different surfaces in addition to the surface of the metal thin film. In some embodiments a silicon-containing protective layer may be formed or deposited on a metal surface of a substrate comprising a metal surface and a second, different surface, such as a dielectric surface. In some embodiments a silicon-containing protective layer may be selectively formed or deposited on a metal surface of a substrate relative to a second, different surface, such as a dielectric surface. For example, in some embodiments a substrate comprising a first metal surface a second, different surface may be subjected to the protective treatment described herein and a silicon-containing protective layer may be formed on the first metal surface relative to the second, different surface. That is, in some embodiments the protective treatment may comprise adsorbing silicon-containing species on the metal surface of a substrate while substantially no silicon-containing species are adsorbed on a second, different surface of the substrate, such as a dielectric surface.

Selectivity can be given as a percentage calculated by, [(deposition on first surface)−(deposition on second surface)]/(deposition on the first surface). Deposition can be measured in any of a variety of ways, and in some embodiments adsorption may be used to calculation selectivity in lieu of deposition. For example, selectivity may be give as a percentage calculated by, [(species adsorption on first surface)−(species adsorption on second surface)]/(species adsorption on the first surface), where species adsorption is the number of species adsorbed. In some embodiments deposition may be given as the measured thickness of the deposited material, such as the silicon-containing protective layer. In some embodiments deposition may be given as the measured amount of material deposited. In some embodiments selectivity is greater than about 10%, greater than about 50%, greater than about 75%, greater than about 85%, greater than about 90%, greater than about 93%, greater than about 95%, greater than about 98%, greater than about 99% or even greater than about 99.5%. In some embodiments the selectivity may be greater than 50%, but less than 99%, greater than 50%, but less than 95%, greater than 50%, but less than 90%, greater than 50%, but less than 85%, greater than 50%, but less than 80%, greater than 50%, but less than 75%, greater than 50%, but less than 70%, or greater than 50%, but less than 60%.

In some embodiments a silicon-containing protective layer may only be formed on the first metal surface and may not be formed or deposited on the second surface. In some embodiments deposition on the first surface of the substrate relative to the second surface of the substrate is at least about 80% selective, which may be selective enough for some particular applications. In some embodiments the deposition on the first surface of the substrate relative to the second surface of the substrate is at least about 50% selective, which may be selective enough for some particular applications. In some embodiments the deposition on the first metal surface of the substrate relative to the second surface of the substrate is at least about 10% selective, which may be selective enough for some particular applications.

In some embodiments a silicon-containing protective layer may consist only of silicon and oxygen, other than impurities. As used herein, an impurity may be considered any element other than Si or O. In some embodiments the silicon-containing protective layer may comprise less than about 20%, less than about 15%, less than about 10%, 5%, or 1% or fewer of impurities.

In some embodiments a protective treatment as described herein may be carried out in the same reaction space as deposition of the metal thin film and thus the metal thin film and substrate are not exposed to an ambient, or other oxidizing atmosphere in between deposition of the metal thin film and formation of the silicon-containing protective layer. In some embodiments the metal thin film and the substrate are exposed to only a non-oxidizing atmosphere and/or vacuum between deposition of the metal thin film and formation of the silicon-containing protective layer. In some embodiments a metal thin film is deposited, for example by an ALD process, and the deposited metal thin film may be protected by exposure to a silicon-containing precursor in the reaction chamber that deposition of the metal film was carried out in. In some embodiments the deposited metal thin film may be exposed to a silicon-containing precursor in a second, different reaction chamber from the reaction chamber that the metal thin film was deposited or formed in. However, the metal thin film is not exposed to an oxidizing environment prior to exposure to the silicon-containing reactant. In some embodiments the metal thin film is exposed to only a non-oxidizing atmosphere and/or vacuum prior to exposure to the silicon-containing reactant.

In some embodiments, before starting subjecting a metal thin film to the protective treatment the metal thin film may be heated or allowed to cool to a suitable process temperature. For example, in some embodiments where a metal thin film is subjected to a protective treatment in the same reaction chamber in which deposition occurred, the metal thin film may be allowed to cool to a suitable process temperature. However, in some other embodiments where a deposited metal thin film is transported to a second, different reaction chamber after deposition the metal thin film may be heated to an appropriate process temperature. In some embodiments the process temperature may be 200° C. or lower, about 150° C. or lower, about 100° C. or lower, about 70° C. or lower, or about 65° C. or lower, or even about 60° C. or lower. In some embodiments the temperature during exposure of the metal thin film to a silicon-containing precursor may still be above about 25° C., above about 50° C., above about 60° C., 65° C., 70° C., 75° C. or greater. In some embodiments the temperature during exposure of the metal thin film to a silicon-containing precursor may have an upper limit of about 200° C.

In some embodiments the second precursor contacts the substrate for about 0.01 seconds to about 300 seconds, for about 1 second to about 240 seconds, for about 10 seconds to about 180 seconds, or for about 30 seconds to about 120 seconds. However, depending on the reactor type, substrate type and its surface area, the second precursor contacting time may be even higher than 300 seconds. The optimum contacting time can be readily determined by the skilled artisan based on the particular circumstances.

The pressure in the reaction chamber may be determined by the skilled artisan. In some embodiments, the pressure within a reaction chamber during a protective treatment is between about 0.1 torr and about 50 torr, though the pressure can be between about 0.5 torr and about 5 torr. The mass flow rate of the silicon-containing precursor may be determined by the skilled artisan. In some embodiments the flow rate of the silicon-containing precursor into the reaction chamber may be from about 1 sccm to about 1000 sccm, from about 25 sccm to about 500 sccm, from about 50 sccm to about 250 sccm, from about 75 sccm to about 125 sccm, or about 100 sccm.

In some embodiments the silicon-containing precursor may be provided to the reaction chamber with the aid of a carrier gas. For example, in some embodiments the silicon-containing precursor may be provided to the reaction chamber with the aid of a carrier gas such as $N_2$, Ar, He, and/or $H_2$. In some embodiments no other reactants are provided with the silicon-containing precursor. In some embodiments no reactants other than the silicon-containing precursor contact the substrate until the silicon-containing protective layer has been formed.

Referring to FIG. 1 and according to some embodiments a metal thin film is deposited and selectively protected by a process 100 comprising:

depositing a metal thin film on a substrate in a reaction chamber at step 110; and exposing the deposited metal thin film to a silicon-containing precursor at a process temperature of less than about 100° C. without exposing the deposited metal film to oxidizing environment at step 120 to thereby selectively form a silicon-containing protective layer on the metal thin film.

In some embodiments the process 100 may further comprise removing any precursors or reaction by-products from the substrate prior to exposing the deposited film to the silicon-containing precursor at step 120. In some embodiments removing any precursors or reaction by-products may comprise exposing the deposited film to a vacuum or an inert purge gas.

In some embodiments step 120 may be carried out in the same reaction chamber as step 110. However, in some embodiments the deposited metal thin film may be transferred to a second, different reaction chamber after step 110 and prior to step 120. In these embodiments where the deposited metal film is transferred to a second, different reaction chamber the deposited metal thin is not exposed to an oxidizing environment prior to step 120.

Silicon-Containing Precursors

In some embodiments the silicon-containing precursor may comprise a silicon-containing compound. In some embodiments the silicon-containing precursor may comprise an inorganic compound. However, in some embodiments the silicon-containing precursor may comprise an organosilicon compound. In some embodiments the silicon-containing precursor may comprise a silane, such as a monosilane, disilane, or trisilane. In some embodiments the silicon-containing precursor may comprise an aminosilane compound.

In some embodiments the silicon-containing precursor may comprise a silicon halide compound. For example, in some embodiments the silicon-containing precursor may comprise a silicon halide such as dichlorosilane and/or diiodosilane. In some embodiments the silicon-containing precursor may comprise a compound having the general formula:

$$SiX_4 \qquad (1)$$

wherein X is a halide.

In some embodiments the silicon-containing precursor may comprise a compound having the general formula:

$$Si_nX_{2n+2} \qquad (2)$$

wherein X is a halide and n is from 1 to 10.

In some embodiments the silicon-containing precursor may comprise a compound having the general formula:

$$SiH_nX_{4-n} \qquad (3)$$

wherein X is a halide and n is from 1 to 10.

In some embodiments the silicon-containing precursor may be a mixed silicon halide, such as $SiClI_3$.

Integration

The protective treatments of the present disclosure may be used in a variety of microfabrication, nanofabrication, and/or semiconductor fabrication applications. For example, silicon-containing protective layers may be particularly useful to provide oxidation protection for metallic cap layers formed on copper interconnects on an integrated circuit workpiece.

The formation of a silicon-containing protective layer, for example a silicon-containing protective layer comprising $SiO_2$, can substantially prevent oxidation of the underlying metallic cap layer as described herein, and may not require removal during further integrated circuit process, for example because subsequent processing may include the deposition of dielectric material on the protected metallic cap layer.

Figure 2A:
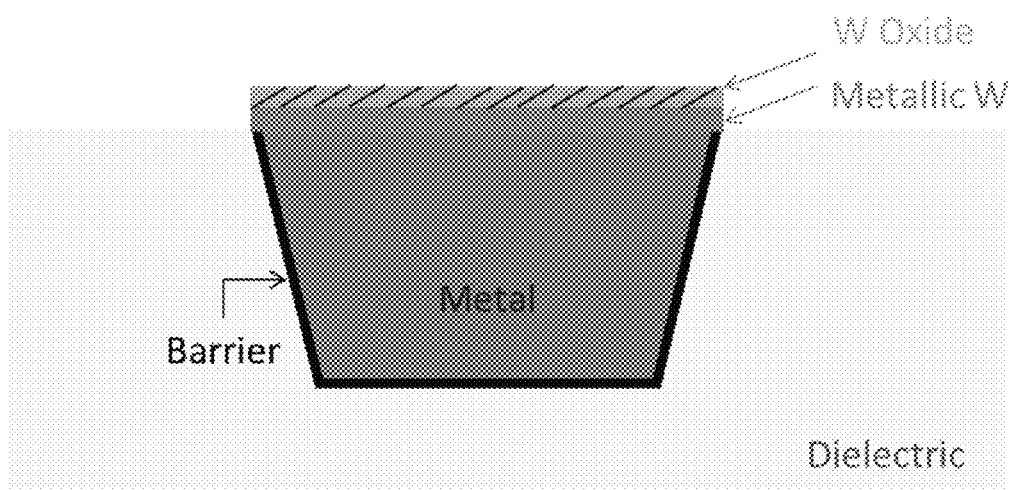
FIG. 2A is a schematic diagram illustrating the structure of a tungsten cap disposed on a metal surface of a substrate comprising a metal surface and a dielectric surface that has not been subjected to a protective treatment process and after exposure to ambient air.
Figure 2B:
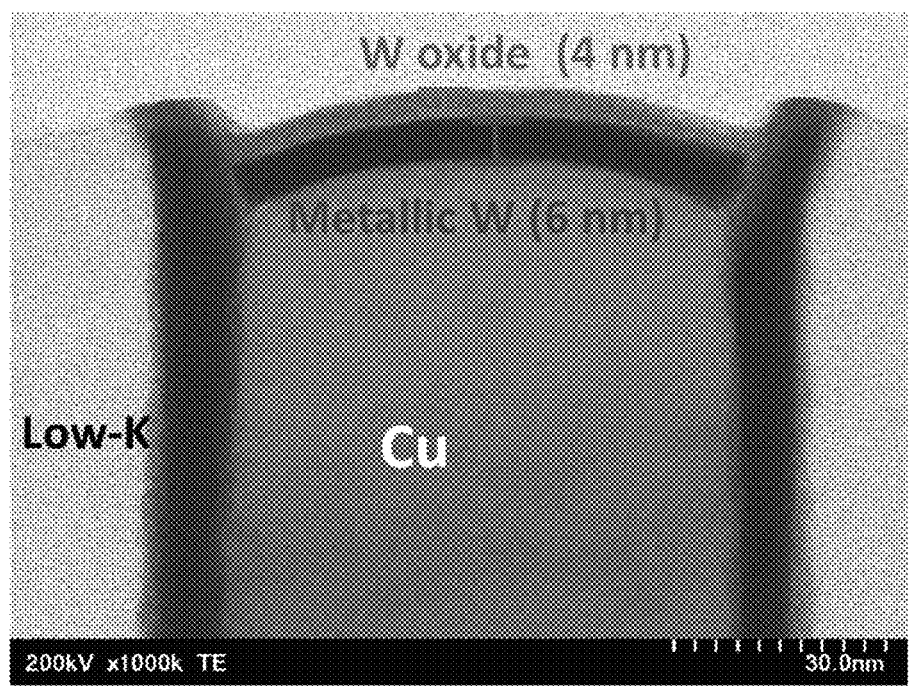
FIG. 2B is a high-resolution transmission electron microscope (HRTEM) image of a cross-section of the structure of a tungsten cap disposed on the metal surface of a substrate comprising a metal surface and a dielectric surface that has not been subjected to a protective treatment process and after exposure to ambient air.

FIG. 2A illustrates the structure of a tungsten cap layer formed on a metallic interconnect in a dielectric substrate that has not been subjected to a protective treatment process as described herein. FIG. 2B shows a HRTEM image of a cross-section of an example tungsten film that was selectively deposited on a Cu interconnect relative to the dielectric surface of the substrate and that was not subjected to a protective treatment process as described herein. The selectively deposited tungsten film was exposed to ambient atmosphere prior to imaging. As can be seen in FIG. 2B, the selectively deposited tungsten film has been oxidized and an undesirable 4 nm thick layer of tungsten oxide is now disposed over 6 nm of metallic tungsten.

Figure 3A:
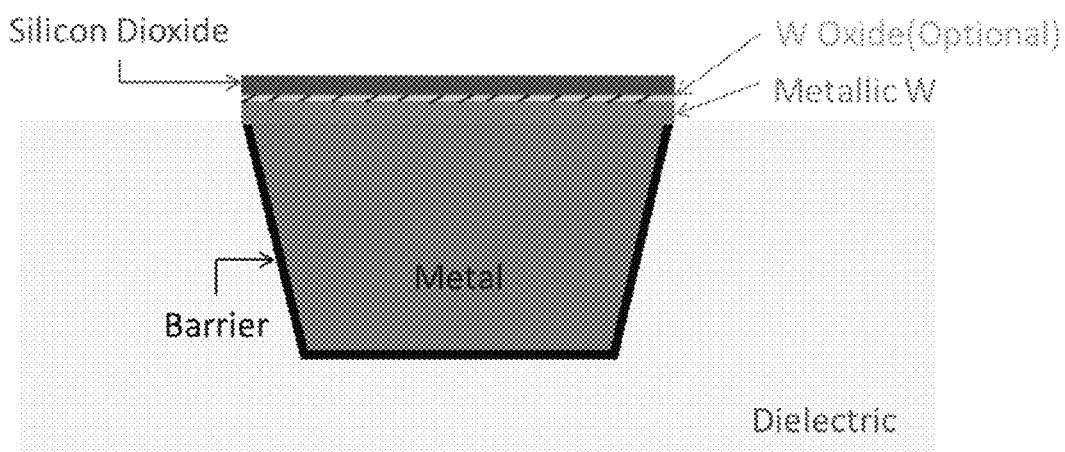
FIG. 3A is a schematic diagram illustrating the structure of a tungsten cap disposed on a metal surface of a substrate comprising a metal surface and a dielectric surface that has been subjected to a protective treatment process prior to exposure to ambient air according to some embodiments.
Figure 3B:
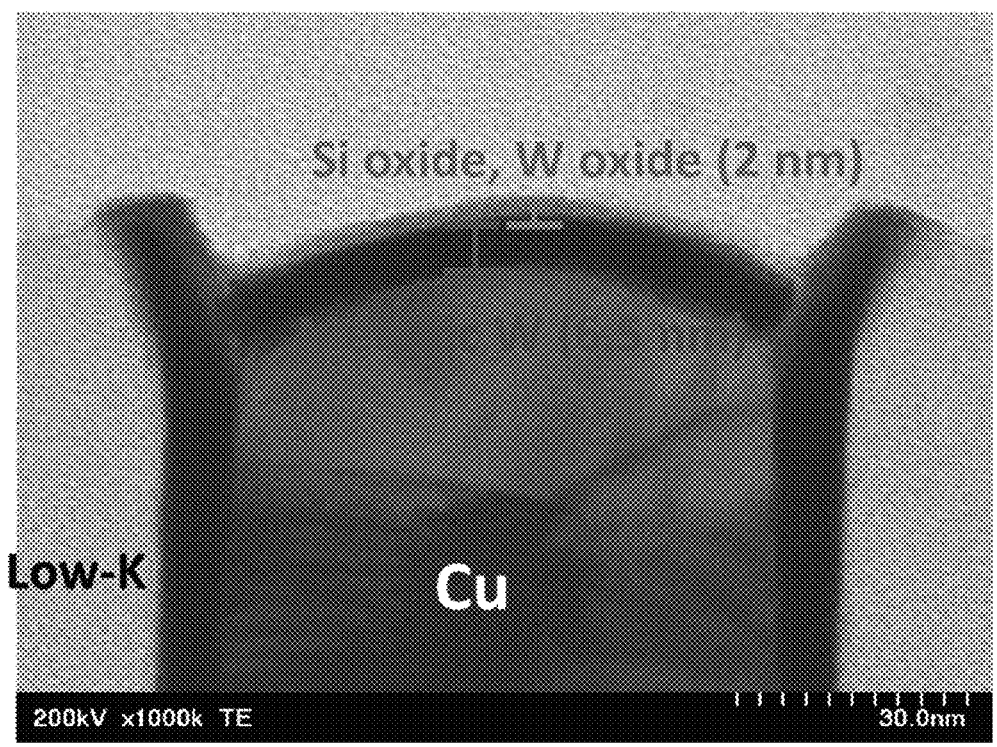
FIG. 3B is a high-resolution transmission electron microscope (HRTEM) image of a cross-section of the structure of a tungsten cap disposed on a metal surface of a substrate comprising a metal surface and a dielectric surface that has been subjected to a protective treatment process prior to exposure to ambient air according to some embodiments.

According to some embodiments a metallic film, such as a tungsten film is deposited on the copper interconnect surface of a substrate relative to the dielectric surface. After deposition of the tungsten film, and without exposing the deposited tungsten film to an oxidizing environment, the tungsten film is subjected to a protective treatment as described herein. The protective treatment may comprise exposing the substrate to a silicon-containing precursor at a temperature of less than about 200° C., less than about 150° C., or less than about 100° C. or lower to form a silicon-containing protective layer on the tungsten film. In some embodiments the silicon-containing protective layer may be selectively formed on the tungsten surface of the substrate relative to a second, different surface of the substrate. The substrate including the protected tungsten cap layer may then be exposed to ambient atmosphere. FIG. 3A illustrates a schematic diagram of the structure of the protected tungsten cap layer. FIG. 3B is an HRTEM image of a cross-section of an example tungsten film that was selectively deposited on a Cu interconnect relative to the dielectric surface of the substrate and that was subjected to a protective treatment process as described herein. As can be seen in FIG. 3B, the silicon-containing protective layer has been oxidized to form silicon oxide while substantially less of the metallic tungsten cap layer has been oxidized as compared to FIG. 2B.

Example 1

A sample copper blanket substrate was introduced into a pre-treatment chamber and mounted to a susceptor. The sample was introduced in a reaction chamber and heated to 300° C. The pressure in the pre-treatment chamber was controlled by the introduction of inert gas and stabilized at 300 Pa. Native oxide was removed from the surface of the sample by annealing for 5 minutes in a mixture of hydrogen and formic acid. The hydrogen flow rate was 0.5 slm, the formic acid flow rate was 0.1 slm and the inert carrier gas flow rate was 0.4 slm. The sample was then unmounted from the susceptor and cooled in the pre-treatment chamber for 5 minutes while hydrogen and an inert carrier gas are flowed into the chamber at flow rates of 0.5 slm for hydrogen and 0.4 slm for the inert carrier gas.

The copper blanket sample was then transferred to the deposition chamber without being exposed to ambient atmosphere and while in non-oxidizing conditions. Tungsten was deposited on the copper by a thermal ALD process. The sample was heated by being mounted on a susceptor heated to 70° C. The pressure in the reaction chamber was increased by the introduction of inert gases and stabilized at 300 Pa. The deposition precursors, disilane and tungsten hexafluoride ($WF_6$), were alternately and sequentially pulsed into the reaction chamber with dislane and $WF_6$ feed times of 0.2 seconds and purge times of 5 seconds. The precursors were provided with the aid of $H_2$ as a carrier gas. The H2 flow rate was 1 slm, the disilane flow rate was 15 sccm and the $WF_6$ flow rate was 20 sccm. The last precursor pulsed into the reaction chamber was $WF_6$.

The reaction chamber was then subjected to a vacuum. Inert gases were introduced into the reaction chamber and the pressure was stabilized at 300 Pa. The tungsten film was then subjected to a protective treatment process as described herein including introducing disilane into the reaction chamber at a flow rate of 100 sccm for 120 seconds. The disilane was provided along with $H_2$ and inert carrier gases. The $H_2$ flow rate was 1 slm and the total flow rate was 4.5 slm. The gas flow is then stopped and the reaction chamber is purged. The sample was taken out of the reaction chamber and exposed to the ambient atmosphere, whereupon the surface was analyzed by XPS and compared with a deposited tungsten film that was not subjected to a protective treatment process.

Figure 4:
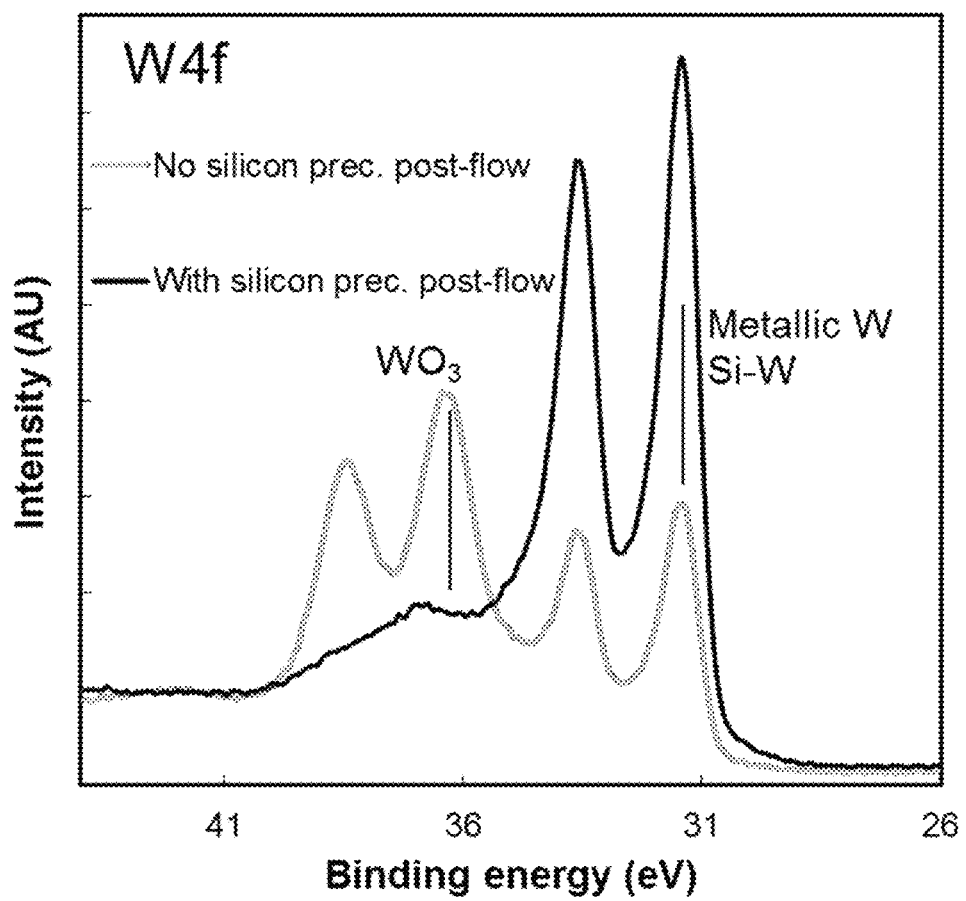
FIG. 4 illustrates the composition of 10 nm tungsten caps deposited on a copper surface, wherein one cap was subjected to a protective treatment process according to some embodiments and one cap was not, as determined by analysis of the W4f peak of X-ray photoelectron spectroscopy (XPS).
Figure 5:
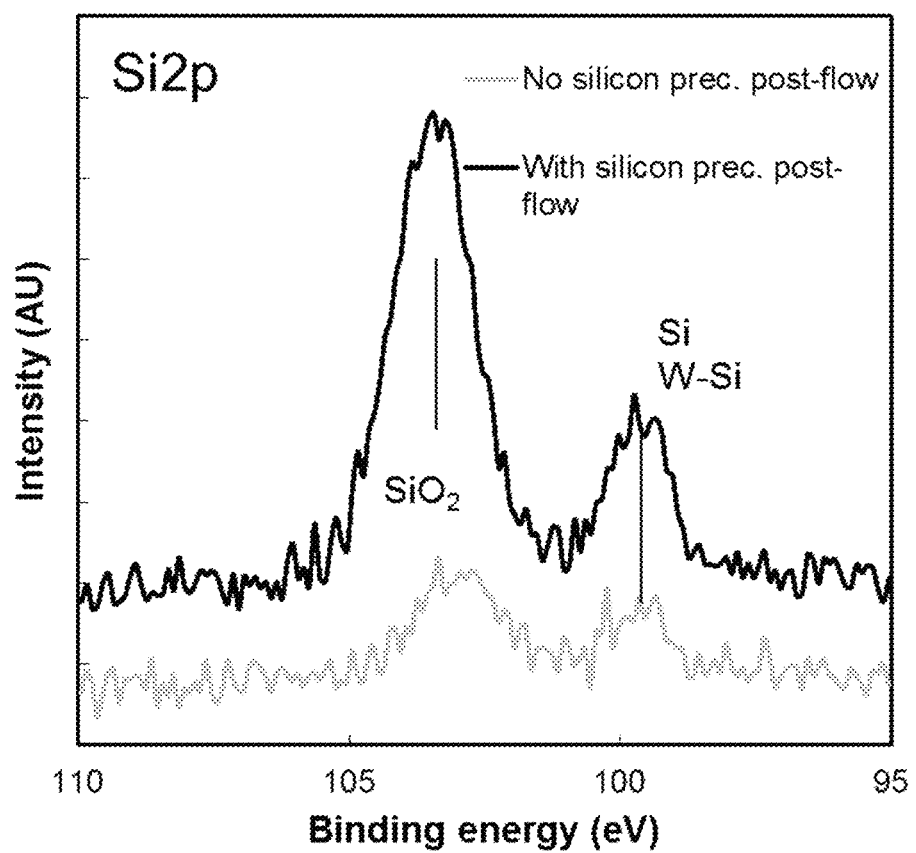
FIG. 5 illustrates the composition of 10 nm tungsten caps deposited on a copper surface, wherein one cap was subjected to a protective treatment process according to some embodiments and one cap was not, as determined by analysis of the Si2p peak of XPS.
Figure 6:
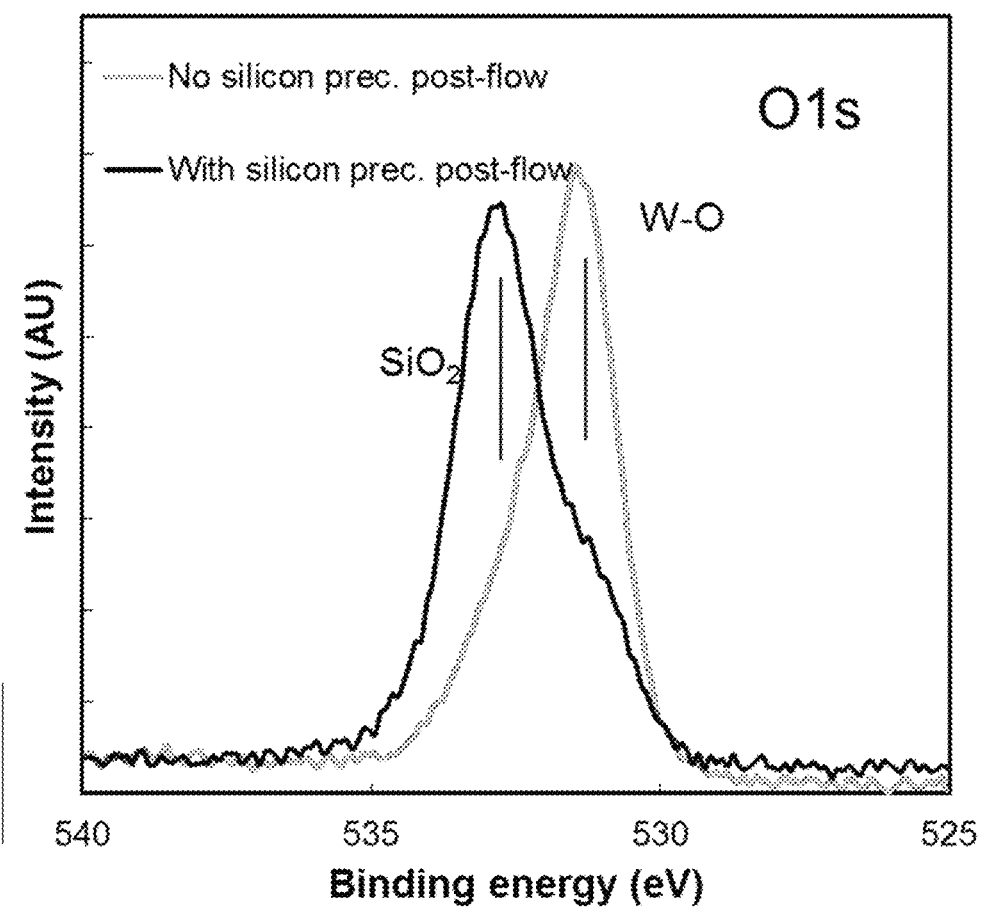
FIG. 6 illustrates the composition of 10 nm tungsten caps deposited on a copper surface, wherein one cap was subjected to a protective treatment process according to some embodiments and one cap was not, as determined by analysis of the O1s peak of XPS.

As shown in FIG. 4, the protective treatment increased the intensity of the metallic W peak in the XPS analysis, while the $WO_3$ peak decreased, indicating that sample subjected to the protective treatment contained more metallic tungsten and less tungsten oxide than the sample that was not subjected to the protective treatment. Similarly, FIG. 5 showed that the protective treatment increased the SiO2 peak in the XPS analysis, indicating the presence of $SiO_2$. FIG. 6 shows a shift from a W—O bonding peak to an $SiO_2$ peak in the XPS analysis for the sample subjected to the protective treatment process. TABLE 1 compares the measured thicknesses of silicon oxide and tungsten oxide for the two samples.

TABLE 1

Oxide thicknesses for tungsten films that did and did not receive protective treatment according to some embodiments.

|  | Silicon Dioxide ($SiO_2$) | W oxide ($WO_3$) |
|---|---|---|
| No Protective Treatment | — | 2.3 nm |
| Protective Treatment | 1 nm | 0.8 nm |

Figure 7A:
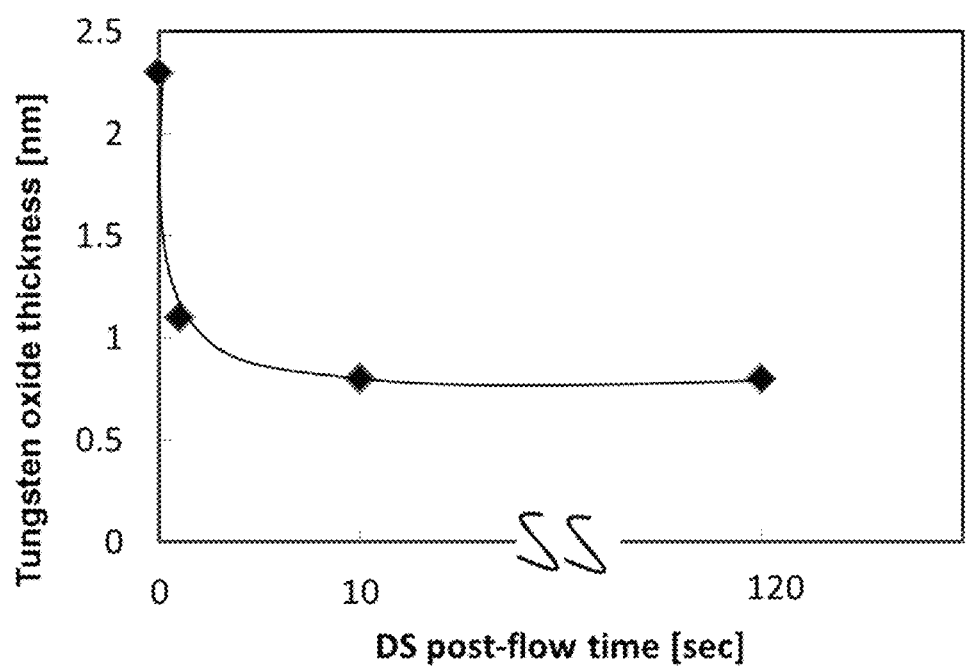
FIG. 7A illustrates tungsten oxide thickness as calculated from the W4f XPS peak deconvolution for 10 nm tungsten caps deposited on a copper surface and subjected to a protective treatment process according to some embodiments as a function of silicon-containing precursor exposure time.

Further experiments were carried out according to the above-described conditions, with the silicon-containing precursor exposure time during the protective treatment varied from 1 second to 120 seconds. The tungsten oxide thickness of the protected tungsten films was then estimated from XPS analysis as shown in FIG. 7A. The protective treatment was found to lead to minimal tungsten oxide formation for exposure times greater than 10 seconds.

Figure 7B:
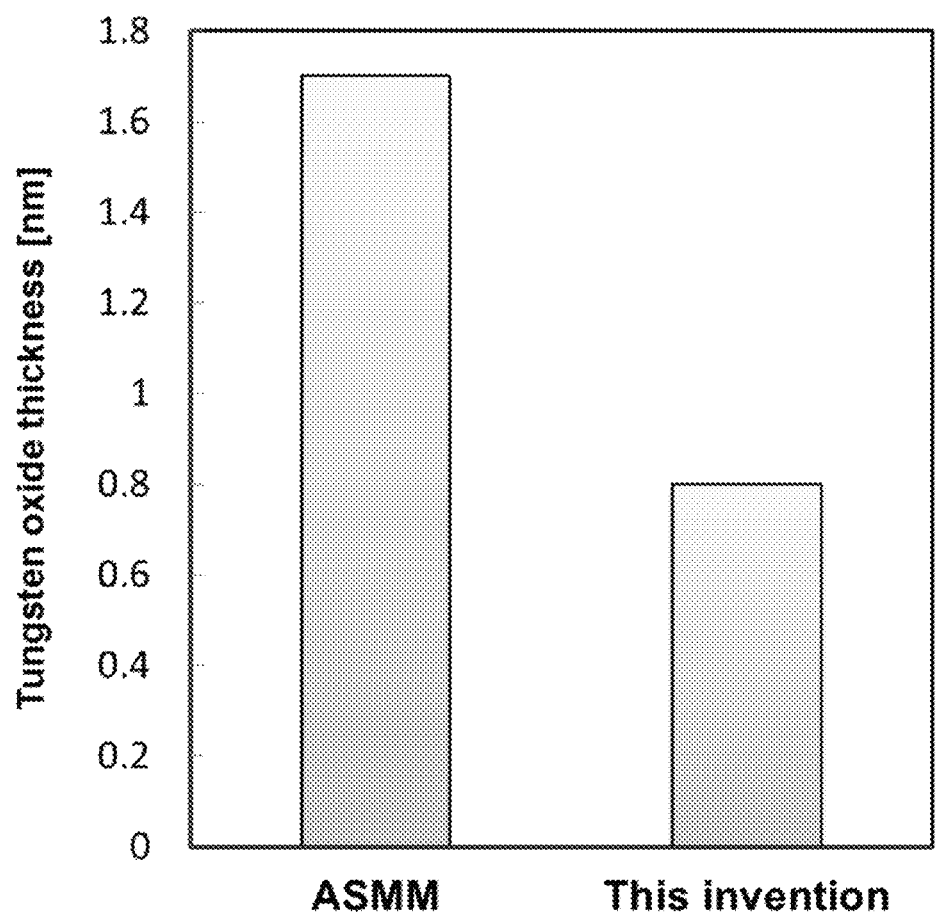
FIG. 7B illustrates tungsten oxide thickness as calculated from the W4f XPS peak deconvolution for a 10 nm tungsten cap deposited on a copper surface as described herein and subjected to a protective treatment process according to some embodiments and a 10 nm tungsten cap deposited on a copper surface.

The tungsten films subjected to a protective treatment as described herein were also compared to tungsten films which were not subjected to a protective treatment and were deposited according to the above-described process but which included disilane as the last precursor pulse during the deposition treatment. The tungsten films subjected to the protective treatment process as described herein were found to have less tungsten oxide as shown in FIG. 7B.

Example 2

A sample cobalt blanket substrate was introduced into a pre-treatment chamber and mounted to a susceptor. The sample was introduced in a reaction chamber and heated to 300° C. The pressure in the pre-treatment chamber was controlled by the introduction of inert gas and stabilized at 300 Pa. Native oxide was removed from the surface of the sample by annealing for 5 minutes in a mixture of hydrogen and formic acid. The hydrogen flow rate was 0.5 slm, the formic acid flow rate was 0.1 slm and the inert carrier gas flow rate was 0.4 slm. The sample was then unmounted from the susceptor and cooled in the pre-treatment chamber for 5 minutes while hydrogen and an inert carrier gas are flowed into the chamber at flow rates of 0.5 slm for hydrogen and 0.4 slm for the inert carrier gas.

The cobalt blanket sample was then transferred to the deposition chamber without being exposed to ambient atmosphere and while in non-oxidizing conditions. The sample was heated by being mounted on a susceptor heated to 70° C. The pressure in the reaction chamber was increased by the introduction of inert gases and stabilized at 300 Pa. The cobalt sample was subjected to a protective treatment as described herein including introducing disilane into the reaction chamber at a flow rate of 100 sccm for 120 seconds. The disilane was provided along with $H_2$ and inert carrier gases. The $H_2$ flow rate was 1 slm and the total flow rate was 4.5 slm. The gas flow is then stopped and the reaction chamber is purged. The sample was taken out of the reaction chamber and exposed to the ambient atmosphere, whereupon the surface was analyzed by XPS and compared with a cobalt sample that was not subjected to a protective treatment process.

Figure 8:
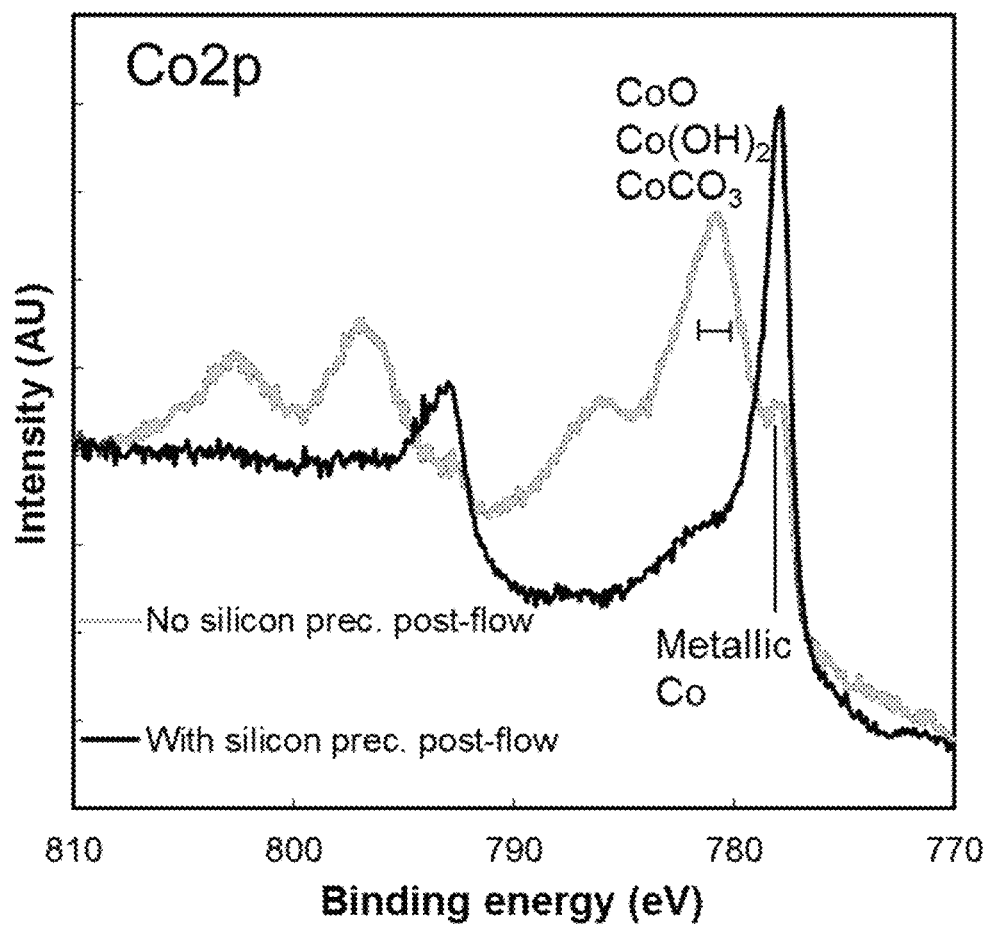
FIG. 8 illustrates the composition of cobalt surfaces subjected to a native oxide removal process, wherein one surface was subjected to a protective treatment process according to some embodiments and one surface was not, as determined by analysis of the Co2p peak of XPS.
Figure 9:
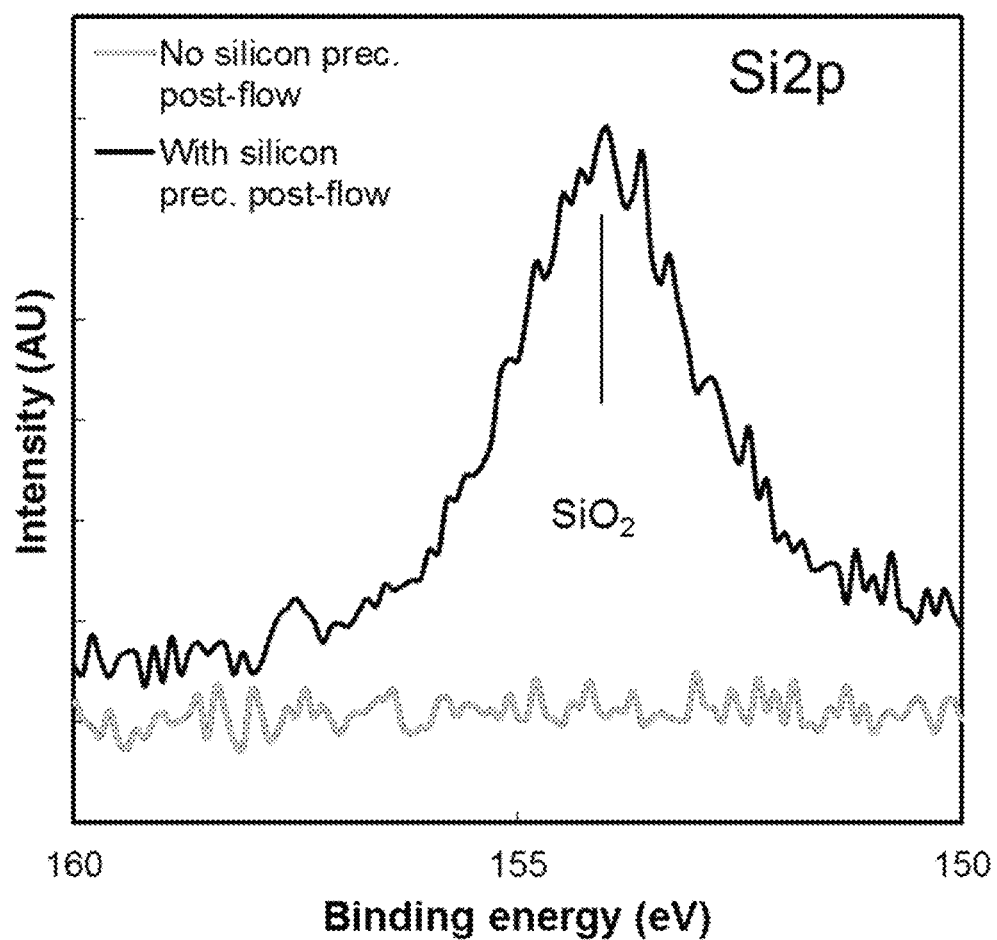
FIG. 9 illustrates the composition of cobalt surfaces subjected to a native oxide removal process, wherein one surface was subjected to a protective treatment process according to some embodiments and one surface was not, as determined by analysis of the Si2p peak of XPS.
Figure 10:
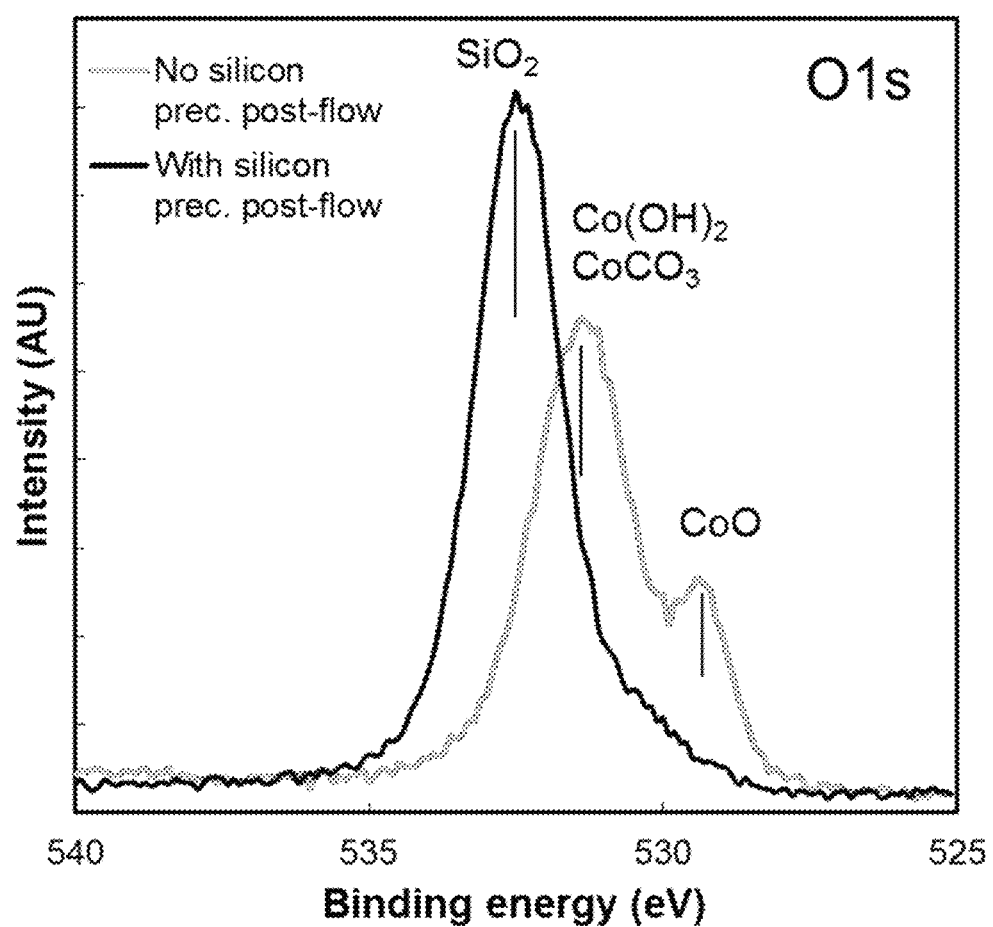
FIG. 10 illustrates the composition of cobalt surfaces subjected to a native oxide removal process, wherein one surface was subjected to a protective treatment process according to some embodiments and one surface was not, as determined by analysis of the O1s peak of XPS.

As shown in FIG. 8, to cobalt oxide ($CoO$, $Co(OH)_2$, $CoCO_3$) XPS peaks for the sample subjected to the pretreatment process were found to be lower than the sample that was not subjected to the pretreatment process, while the opposite was found for the metallic Co peak. As shown in FIG. 9, the protective treatment increased the SiO2 peak in the XPS analysis, indicating the presence of $SiO_2$. FIG. 10 shows a shift from the cobalt oxide peaks to an $SiO_2$, peak in the XPS analysis for the sample subjected to the protective treatment process. TABLE 2 compares the measured thicknesses of cobalt oxide for the two samples.

TABLE 2

Cobalt oxide thicknesses for cobalt samples that did and did not receive protective treatment according to some embodiments.

| | Co oxide |
|---|---|
| No silicon prec. post-flow | 1.8 nm |
| With silicon prec. post-flow | 0.2 nm |

Although certain embodiments and examples have been discussed, it will be understood by those skilled in the art that the scope of the claims extend beyond the specifically disclosed embodiments to other alternative embodiments and/or uses and obvious modifications and equivalents thereof.

What is claimed is:

1. A process for protecting a metal thin film from oxidation in an oxidizing environment comprising:
    depositing a metal thin film on a substrate in a reaction chamber;
    exposing the deposited metal thin film to a silicon-containing precursor at a process temperature of less than about 200° C. to thereby adsorb no more than about a monolayer of silicon-containing species on the metal thin film,
    wherein the deposited metal thin film is exposed to the silicon-containing precursor prior to being exposed to an oxidizing environment.

2. The process of claim 1, wherein the silicon-containing species are adsorbed on the metal thin film relative to a second, different surface of the substrate with a selectivity of greater than about 50%.

3. The process of claim 1, wherein a thickness of the adsorbed silicon-containing monolayer is from about 0.1 nm to about 2 nm.

4. The process of claim 1, wherein the silicon-containing precursor comprises an aminosilane compound.

5. The process of claim 1, wherein the silicon-containing precursor comprises a silane compound.

6. The process of claim 5, wherein the silicon-containing precursor comprises disilane.

7. The process of claim 1, wherein the deposited metal thin film is exposed to the silicon-containing precursor for more than about 10 seconds.

8. The process of claim 1, wherein the deposited metal thin film is exposed to the silicon-containing precursor for less than about 120 seconds.

9. The process of claim 1, wherein the deposited metal thin film comprises W, Co, Cu, TiN, TaN, and/or a mixture thereof.

10. The process of claim 1, wherein the deposited metal thin film comprises Co and/or W.

11. The process of claim 1, wherein depositing the metal thin film and exposing the deposited metal thin film to the silicon-containing precursor steps are carried out in the same reaction chamber.

12. The process of claim 1, wherein depositing the metal thin film and exposing the deposited metal thin film to the silicon-containing precursor steps are carried out in different reaction chambers.

13. A process for protecting a metal thin film from oxidation in an oxidizing environment comprising:
    providing a metal thin film on a substrate comprising at least a dielectric surface in a reaction chamber;
    exposing the metal thin film to a silicon-containing precursor at a process temperature of less than about 200° C. to thereby selectively adsorb no more than about a monolayer of silicon-containing species on the metal thin film relative to the dielectric surface of the substrate,
    wherein the deposited metal thin film is exposed to the silicon containing precursor prior to being exposed to an oxidizing environment, and
    wherein the silicon-containing species are adsorbed onto the metal thin film relative to the dielectric surface with a selectivity of greater than about 50%.

14. The process of claim 13, wherein the silicon-containing precursor comprises a silane compound.

15. The process of claim 13, wherein the deposited metal thin film is exposed to the silicon-containing precursor for more than about 10 seconds.

16. The process of claim 13, wherein the deposited metal thin film comprises W, Co, Cu, TiN, TaN, and/or a mixture thereof.

17. The process of claim 16, wherein the dielectric surface comprises a silicon-containing surface and/or a metal oxide surface.

18. The process of claim 17, wherein the silicon-containing surface comprises $SiO_2$, SiN, SiOC, SiON, and/or SiOCN.

19. The process of claim 17, wherein the metal oxide surface comprises $TiO_2$, $Ta_2O_5$, and/or $Al_2O_3$.

20. The process of claim 13, wherein depositing the metal thin film and exposing the deposited metal thin film to the silicon-containing precursor steps are carried out in the same reaction chamber.

21. The process of claim 13, wherein depositing the metal thin film and exposing the deposited metal thin film to the silicon-containing precursor steps are carried out in different reaction chambers.

* * * * *